(12) United States Patent
Wischnewskij et al.

(10) Patent No.: US 8,604,665 B2
(45) Date of Patent: Dec. 10, 2013

(54) PIEZOELECTRIC ACTUATOR FOR AN ULTRASONIC MOTOR

(75) Inventors: Wladimir Wischnewskij, Waldbronn (DE); Alexej Wischnewskij, Woerth (DE)

(73) Assignee: Physik Instrumente (PI) GmbH & Co. KG, Karlsruhe (DE)

( * ) Notice: Subject to any disclaimer, the term of this patent is extended or adjusted under 35 U.S.C. 154(b) by 969 days.

(21) Appl. No.: 11/990,348

(22) PCT Filed: Jul. 31, 2006

(86) PCT No.: PCT/EP2006/064832
§ 371 (c)(1),
(2), (4) Date: Sep. 30, 2009

(87) PCT Pub. No.: WO2007/020177
PCT Pub. Date: Feb. 22, 2007

(65) Prior Publication Data
US 2010/0013353 A1    Jan. 21, 2010

(30) Foreign Application Priority Data
Aug. 19, 2005   (DE) .................... 10 2005 039 358

(51) Int. Cl.
*H01L 41/08* (2006.01)
(52) U.S. Cl.
USPC ........................................... 310/317
(58) Field of Classification Search
USPC ........ 310/317–318, 323.01–323.02, 328, 311
IPC ............................................ H01L 41/08,41/09
See application file for complete search history.

(56) References Cited

U.S. PATENT DOCUMENTS

| 4,019,073 | A | * | 4/1977 | Vishnevsky et al. ...... 310/323.16 |
| 5,134,334 | A | | 7/1992 | Onishi et al. ................... 310/323 |
| 5,416,375 | A | | 5/1995 | Funakubo et al. ............. 310/323 |
| 5,665,918 | A | | 9/1997 | Takano et al. .................... 73/662 |
| 5,672,930 | A | | 9/1997 | Narisawa et al. .............. 310/323 |
| 5,714,833 | A | | 2/1998 | Zumeris ........................ 310/328 |
| 6,081,063 | A | * | 6/2000 | Kasuga et al. ............ 310/323.02 |
| 6,384,515 | B1 | | 5/2002 | Ganor et al. ................... 310/328 |
| 6,765,335 | B2 | * | 7/2004 | Wischnewskiy ......... 310/323.02 |
| 2004/0256954 | A1 | | 12/2004 | Magnussen et al. .......... 310/328 |
| 2005/0052095 | A1 | * | 3/2005 | Kasai et al. .................... 310/317 |

FOREIGN PATENT DOCUMENTS

| EP | 1 267 425 | 12/2002 | .............. H01L 41/09 |
| WO | WO 00/74153 | 12/2000 | .............. H01L 41/09 |
| WO | WO0074153 | * 12/2000 | .............. H01L 41/09 |
| WO | WO 2006/099924 | 9/2006 | .............. G02B 7/10 |

* cited by examiner

*Primary Examiner* — Thomas Dougherty
*Assistant Examiner* — Karen B Addison
(74) *Attorney, Agent, or Firm* — Gerald T. Bodner

(57) ABSTRACT

A piezoelectric actuator, especially for an ultrasonic motor, includes an acoustic oscillation resonator, wherein the acoustic oscillation resonator is substantially formed as a rectangular piezoelectric plate with two main surfaces, two side surfaces and two end faces and has a multilayer structure in its interior which represents a layer of excitation electrodes taking turns with the layers of the common electrodes and the layers of polarized ceramic provided therebetween, with the polarization vector extending perpendicularly with respect to the surface of the electrodes, wherein all excitation electrodes are divided into two groups not connected to each other, which are disposed symmetrically with respect to the symmetry surface of the aforementioned plate, wherein this symmetry surface extends perpendicularly with respect to the main and side surfaces of the plate, namely through the center thereof.

14 Claims, 25 Drawing Sheets

PIEZOELECTRIC ACTUATOR FOR AN ULTRASONIC MOTOR

STATEMENT REGUARDING FEDERALLY SPONSORED RESERCH OR DEVELOPMENT

Not Applicable

THE NAMES OF THE PARTIES TO A JOINT RESERCH AGREEMENT

Not Applicable

INCORPORATED-BY-REFERENCE OF MATERIAL SUBMITTED ON A COMPACT DISC

Not Applicable

BACKGROUND OF THE INVENTION (1). Field of the Invention

The invention relates to piezoelectric actuators for rotary ultrasonic and linear motors. These can be employed for driving motors for linear and rotary motions. Moreover, they can be used for driving instrument racks, optical lenses, optical write and read heads as well as other similar devices requiring a high positioning accuracy, small dimensions of the drive system and low supply voltages.

(2). Description of Related Art

Known are piezoelectric actuators for ultrasonic motors comprised of a metallic resonator for acoustic waves, with pasted-on lamellar piezoelectric elements, which excite acoustic waves in the resonator (see, inter alia, U.S. Pat. Nos. 5,665,918; 5,672,930).

The drawback of these actuators resides in the large dimensions thereof, which are defined by the dimensions of the metallic resonator. Moreover, these actuators have a small volume of the piezoelectric active part as well as a great thickness of the piezoelectric element, which reduces the electromechanical coupling coefficient significantly so that the excitation voltage is considerably higher. Such actuators additionally have a complicated structure, which requires an assembly by hand and increases the manufacturing costs.

Further known are piezoelectric actuators for ultrasonic motors (see, inter alia, U.S. Pat. Nos. 5,134,334; 5,416,375) whereof the piezoelectric elements are connected as thin lamellae packets to the metallic resonator. The drawbacks of these actuators reside in their large dimensions, their complicated structure and the high manufacturing costs.

Additionally known are piezoelectric actuators for ultrasonic motors comprised of piezoelectric plates, with electrodes mounted on the two main surfaces thereof (see, inter alia, U.S. Pat. Nos. 6,384,515; 7,714,833).

The drawback is that these actuators require a high excitation voltage. This is due to the fact that a bending resonance with a low electromechanical coupling coefficient is used. The maximum excitation voltage of such actuators reaches values of 300 $V_{eff}$. Another significant disadvantage is the presence of a second longitudinal resonance which is within the range of the bending resonance. This makes it harder to control these actuators, with the result that it is impossible to construct simple excitation circuits operated according to the self-excitation principle, whereof the excitation frequency is predetermined by the actuator itself. This leads to a significant reduction of the thermal stability of the drive, reduces the operational safety of the actuators and renders the production more expensive.

Further known are miniaturized piezoelectric actuators for ultrasonic motors, in which the multilayer piezoelectric element is pressed into the body of the metallic resonator (see, inter alia, US 2004/0256954 A1). These actuators are small in size and have low excitation voltages.

The operating principle of these actuators is based on the excitation of two types of standing waves in the resonator on resonance frequencies lying close together. Therefore, to reverse the motion of the mobile element, the frequency of the excitation circuit has to be tuned from the one to the other resonance frequency. This does not allow the configuration of an excitation circuit based on the self-excitation principle, the frequency of which is predetermined by the mechanical parameters of the actuator. By this, the operating stability of the actuator is reduced, the structure of the excitation circuit is rendered more complicated and the drive system as a whole is rendered more expensive.

OBJECTS AND SUMMARY OF THE INVENTION

It is the object of the invention to provide an improved piezoelectric actuator of the generic type, which is characterized by smaller dimensions, lower excitation voltages, greater operating stability and safety as well as by a simplified control and lower manufacturing costs.

This object is achieved with a device comprising the features of claim 1. Useful embodiments of the inventive idea are defined in the dependent claims.

The invention includes the idea of constructing a piezoelectric actuator for ultrasonic motors with a control unit for this actuator in a constructive embodiment, which allows for a simply constructed excitation device in the control unit operating according to the self-excitation principle, the excitation frequency of which is predetermined by the mechanical parameters of the actuator.

It is provided that in the piezoelectric actuator for the ultrasonic motor, which is comprised of an acoustic oscillation resonator with a multilayer generator for an acoustic standing wave, the acoustic oscillation resonator is formed as a rectangular piezoelectric plate with two main surfaces, two side surfaces and two end faces and has a multilayer structure in its interior. This multilayer structure represents layers of excitation electrodes taking turns with the layers of the common electrodes and the layers of polarized ceramic provided therebetween, with the polarization vector extending perpendicularly with respect to the surface of the electrodes. All excitation electrodes are divided into two groups not connected to each other, which are disposed symmetrically with respect to the symmetry surface of the aforementioned plate. This symmetry surface thereby extends perpendicularly with respect to the main and side surfaces of the plate, namely through the center thereof, with each group of the excitation electrodes forming together with the common electrodes and the piezoceramic therebetween a multilayer generator for an acoustic wave which is arranged asymmetrically with respect to the symmetry surface of the piezoelectric plate.

In a preferred embodiment of the piezoelectric actuator the common electrodes may be comprised of two parts the configuration of which repeats the configuration of the excitation electrodes. This increases the possibilities to use the actuator as proposed.

In the various embodiment modifications of the actuator the excitation electrodes and the common electrodes may be arranged in parallel to the end faces of the piezoelectric plate. This increases the longitudinal component of the deformation of the actuator.

In other modifications of the piezoelectric actuator for the ultrasonic motor the excitation electrodes and the common electrodes may be arranged in parallel to the lateral edges of the piezoelectric plates. This increases the vertical component of the deformation of the actuator.

In the following useful embodiments of the actuator the excitation electrodes and the common electrodes may be arranged in parallel to the main surfaces of the piezoelectric plate. This compensates for a different excitation intensity between the longitudinal and the vertical deformation components of the actuator.

In the actuator as proposed electrically conductive electrodes may be mounted on at least one side surface of the piezoelectric plate of the ultrasonic motor, which connect the excitation and common electrodes to each other.

The electrically conductive electrodes, which connect the excitation electrodes and the common electrodes to each other, may also be mounted on at least one of the main surfaces of the piezoelectric plate.

The electrically conductive electrodes, which connect the excitation electrodes and the common electrodes to each other, may also be mounted on the end faces of the piezoelectric plate.

All this increases the constructive possibilities of the actuator according to the invention.

In some modifications of the piezoelectric actuator as proposed a friction element may be provided on at least one of the side surfaces of the piezoelectric plate of the actuator. This allows the use of the actuator as proposed in motors having a mobile friction rail.

In other embodiments of the piezoelectric actuator according to the invention a friction layer may be provided on at least one of the side surfaces of the piezoelectric plate of the actuator. This allows the use of the actuator as proposed in motors having sliding blocks.

According to the invention, the control unit of the actuator may be comprised of a single-channel autogenerator with a power amplifier and a feedback loop, with a feedback element and a direction reversing switch, which alternately couples the power amplifier to the corresponding acoustic wave generator. This permits a simplification of the control unit.

The control unit for the actuator may also be comprised of a dual-channel autogenerator with two power amplifiers and one feedback loop, with a feedback element and a direction reversing switch, which alternately couples the feedback loop to the corresponding channel of the autogenerator. This increases the efficiency of the actuator.

The feedback element in the control unit for the actuator may be formed of a resistor, a capacitor or of both components, which are connected in parallel and to the group of the common electrodes of the piezoelectric actuator. This simplifies the feedback element.

In any one of the modifications of the control unit of the actuator the feedback element may comprise a capacitor of a variable frequency filter in the form of a series LC circuit which is connected to the group of the common electrodes of the piezoelectric actuator. This permits an increase of the voltage in the feedback loop.

In the control unit of the actuator as proposed, the capacitance of the capacitor in the feedback loop of the series LC circuit with the variable frequency filter may be equal to the electrical capacitance of the actuator between one of the groups of the excitation electrodes and a group of the common electrodes. This optimizes the parameters of the variable frequency filter.

Additionally, the control unit of the actuator according to the invention may have a broad pulse voltage controller the output of which is connected to the input of the voltage source of the single-channel or dual-channel autogenerator, with the control input thereof forming the analog input for controlling the excitation level of the actuator. This permits an analog control of the actuator.

The synchronization input of the broad pulse voltage controller in the control unit of the actuator can be connected to the signal circuit of the single-channel or dual-channel autogenerator directly or via a frequency multiplier. This permits to increase the interference protection of the assembly and its operating speed.

BRIEF DESCRIPTION OF THE DRAWINGS

Advantages and effects of the inventions become more apparent from the following description of preferred embodiments by means of the figures. The figures show.

DETAILED DESCRIPTION OF THE PREFERRED EMBODIMENTS

Figure 1:
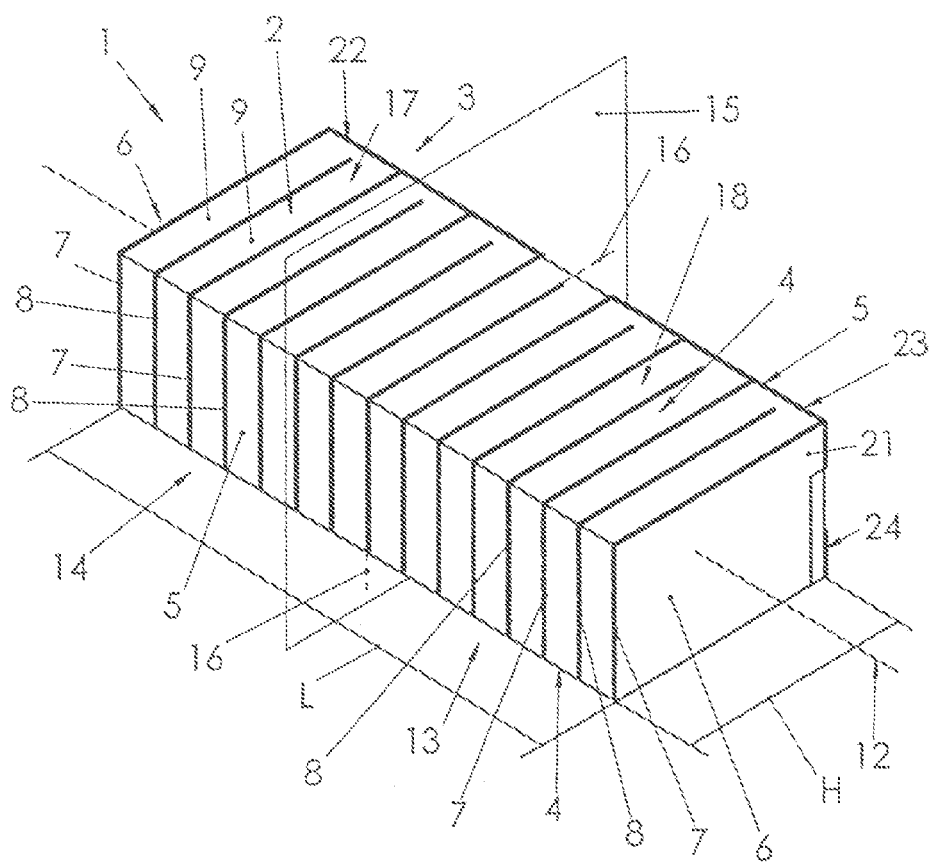
FIG. 1 a principal modification of the actuator as proposed.
Figure 2:
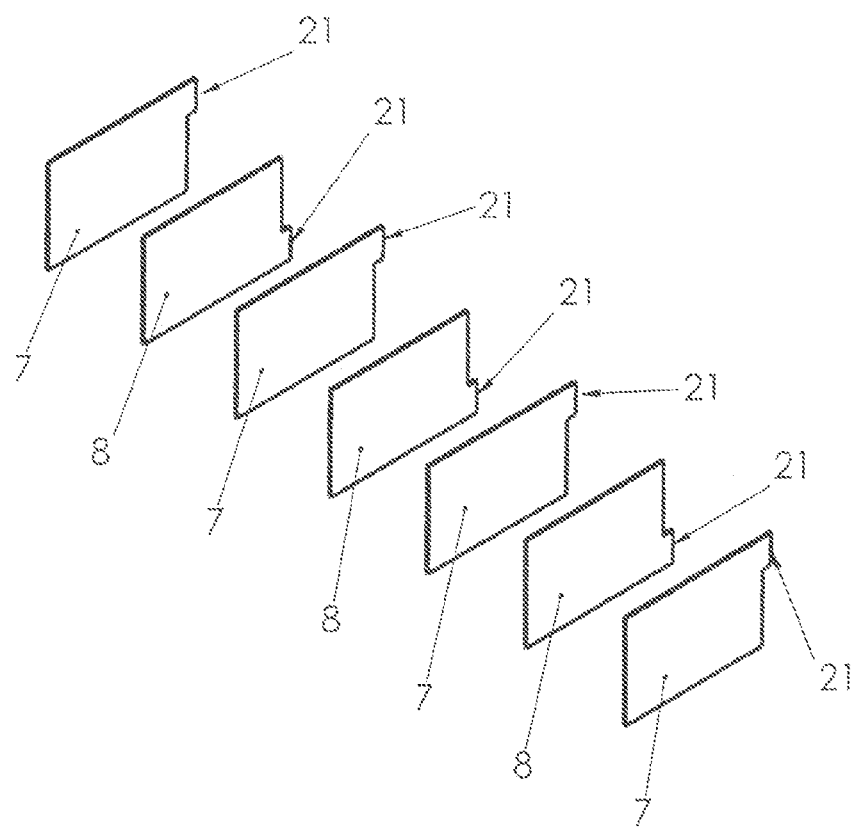
FIG. 2 an electrode configuration of the basic modification of the actuator as proposed, FIG. 3 the direction of polarization of the piezoceramic of the actuator, FIG. 4 a modified embodiment of the actuator as proposed, FIG. 5 a modified embodiment of the actuator electrodes of FIG. 4, FIG. 6 the realization of the actuator according to the invention, FIG. 7 the electrode configuration of the actuator of FIG. 6, FIG. 8 a modified embodiment of the actuator as proposed, FIG. 9 a modification of the electrode configuration of the actuator of FIG. 8, FIG. 10 a modification of the electrode configuration of the actuator of FIG. 8, FIG. 11 a modified embodiment of the actuator as proposed, FIG. 12 a modification of the electrode configuration of the actuator of FIG. 11, FIG. 13 an actuator with one friction element, FIG. 14 an actuator with two friction elements, FIG. 15 an actuator with one friction layer, FIG. 16 an actuator with two friction layers, FIG. 17 an actuator with a control unit, FIG. 18 drawings explaining the operating principle of the actuator as proposed, FIG. 19, 20 modified embodiments of ultrasonic motors comprising the actuator as proposed, FIG. 21 frequency characteristics of the actuator as proposed, FIG. 22 an electric circuit of the control unit of the actuator having a single-channel autogenerator, FIG. 23 an electric circuit of the control unit of the actuator having a dual-channel autogenerator, FIG. 24 an electric circuit of the control unit of the actuator having a broad pulse voltage controller, FIG. 25 an application example of the actuator as proposed.

FIG. 1 shows a piezoelectric actuator 1 for ultrasonic motors. It is comprised of an acoustic oscillation resonator 2. The resonator 2 is formed as a rectangular piezoelectric plate 3 with two main surfaces 4, two side surfaces 5 and two end faces 6, with L being the plate length 3 along the side surface 5 and H being the height along the end face 6. The ratio of L/H of the actuator 1 as proposed is between 2 and 3.

Figure 3:
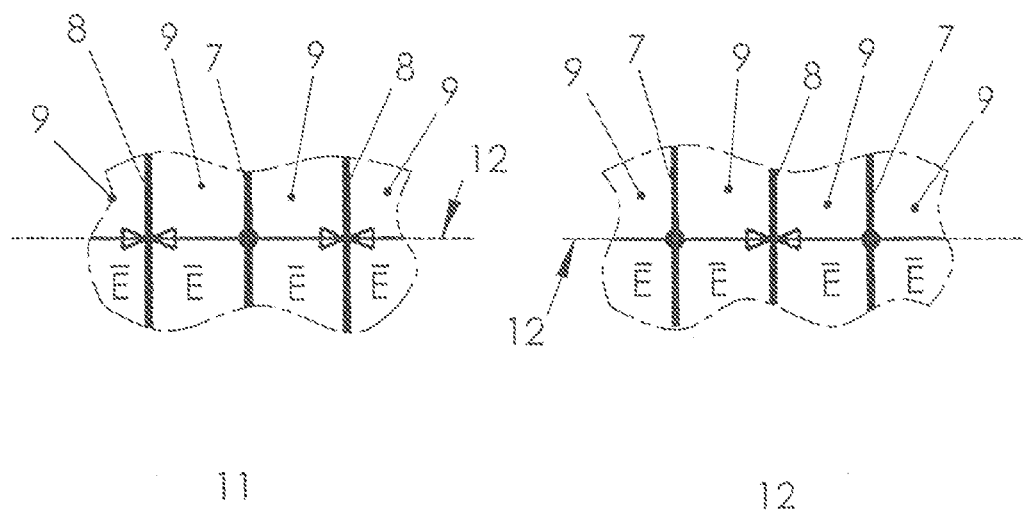

The piezoelectric plate 3 has a multilayer structure in its interior, which is formed of parallel layers of excitation electrodes 7 taking turns with parallel layers of common electrodes 8 (see FIG. 3) and layers of polarized piezoceramic 9 provided therebetween, the polarization vector extending perpendicularly with respect to the electrode surfaces 7 and 8, see arrows in FIG. 3, Position 10 and 11. The direction of the polarization vector coincides with that of the polarization axis of the piezoelectric plate 3, see dotted line 12, illustrated in FIG. 3 and other figures.

All excitation electrodes 7 are divided into two groups of electrodes 13 and 14 not connected to each other, which are disposed symmetrically with respect to a symmetry surface 15, which extends perpendicularly with respect to the main surfaces 4 and side surfaces 5 of the plate 3, namely through the center of these edges. The dashed line 16 in FIG. 1 and all other figures shows the line of intersection of surface 15 with surfaces 4 and 5. Each of the lines forms the center line of the corresponding surface.

The excitation electrode groups 13 and 14 form together with parts of the common electrodes 7 and the piezoceramic layers 9 provided therebetween multilayer generators 17 and 18 for the acoustic standing wave. Each generator 17 or 18 is arranged asymmetrically with respect to the symmetry surface 15.

The piezoceramic multilayer plate 3 is produced in correspondence with multilayer technology. In general, this technology can be described as follows: First, a thin tape of a low-temperated piezoelectric raw material is produced, in which the particles are bonded to each other by an organic binder. Next, sheets are cut out from the tape. Now, the electrodes made of palladium paste are applied. Then, the sheets are pressed together as a compact block to form plate 3 and are baked in the furnace. During the baking the organic binder volatilizes from the piezoceramic, the piezoceramic is sintered, and the metallic electrodes are formed from the palladium paste. The usual thickness of the layers with this technology amounts to 30 to 50 micrometers.

Figure 10:
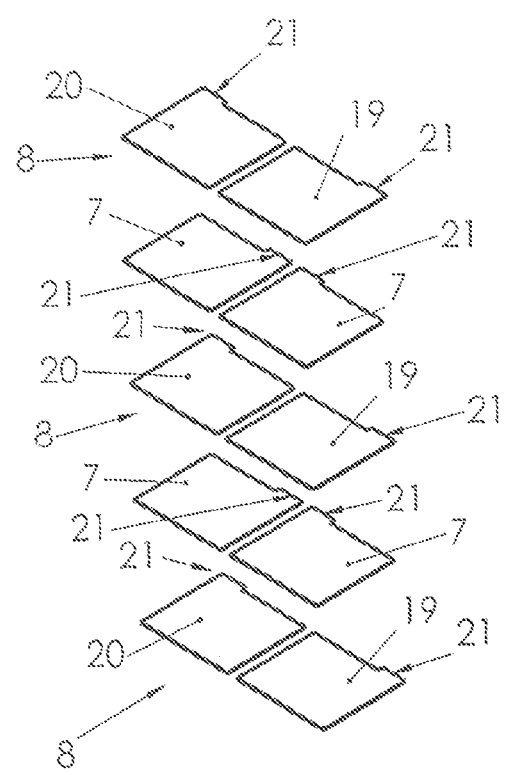

The common electrodes 8 may consist of two like parts 19 and 20, which repeat the configuration of the excitation electrodes 7 as illustrated in FIG. 10.

Each of the electrodes 7, 8 or each part 19, 20 of the electrodes has an electrically conductive shoulder 21 (see FIGS. 1, 2, 4, 5, 6, 7, 8, 9, 10, 11, 12) which is electrically connected to the electrically conductive electrodes 22, 23 and 24 (see FIGS. 1, 4, 6, 8, 11, 13, 14, 15, 16).

By means of ion sputtering of chromium, copper, nickel, silver and a subsequent burn-in the electrically conductive electrodes can be applied to the sintering surface of the plate 3.

Figure 4:
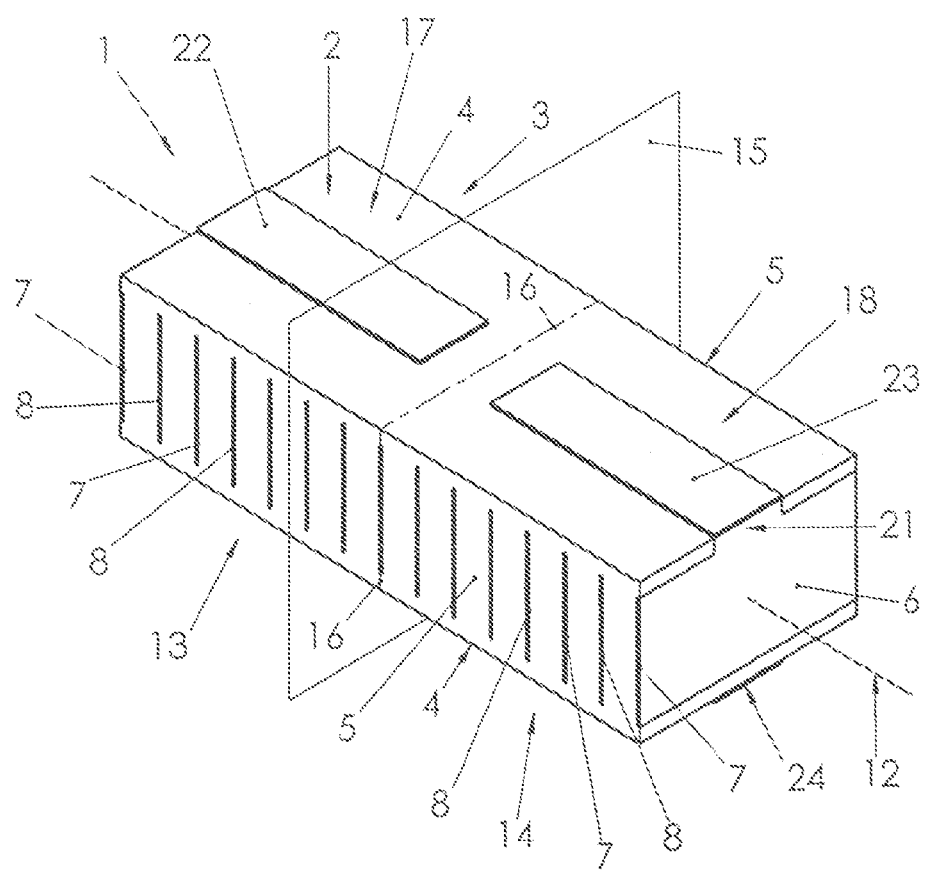
Figure 5:
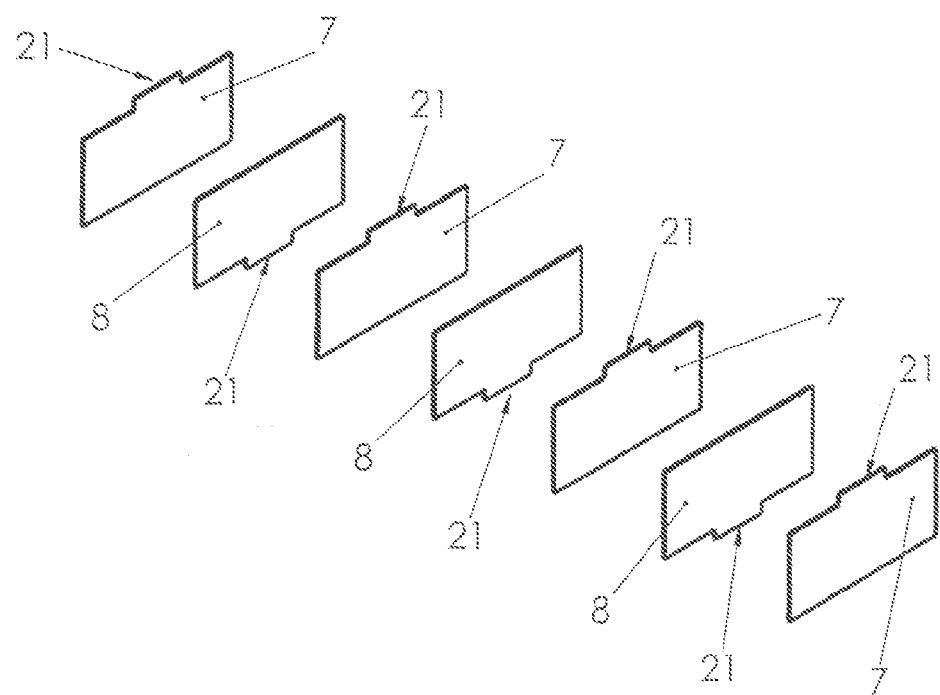
Figure 6:
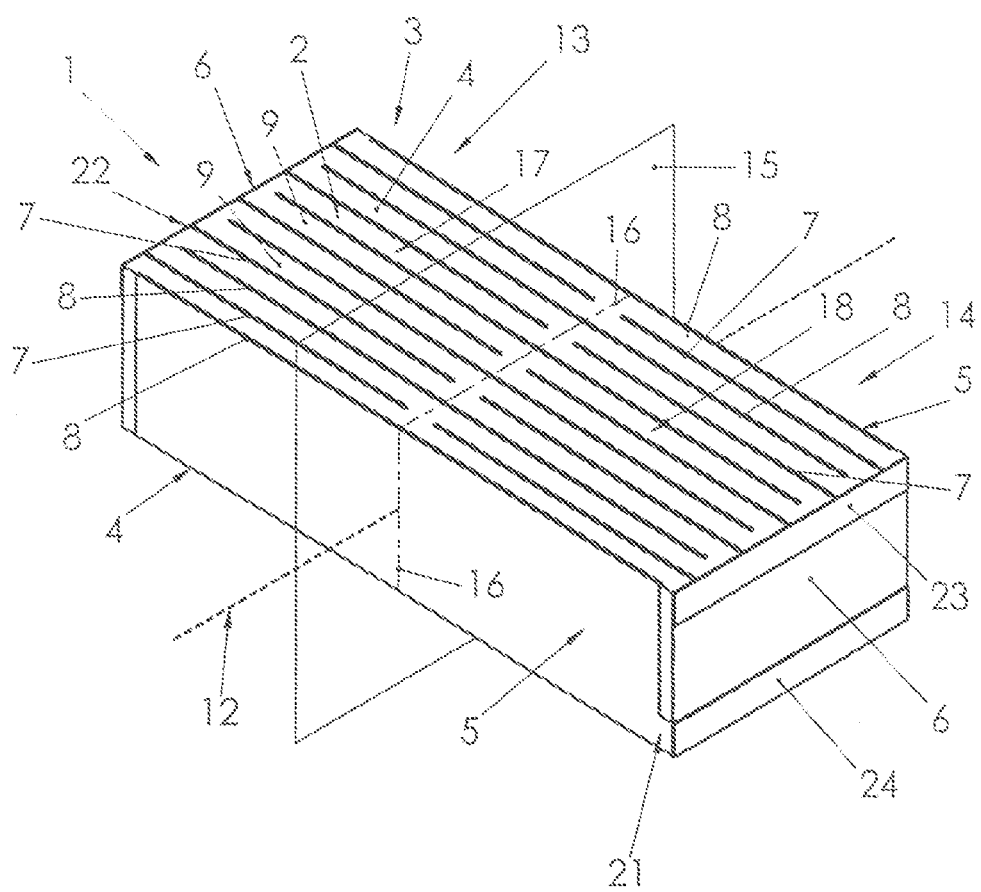
Figure 7:
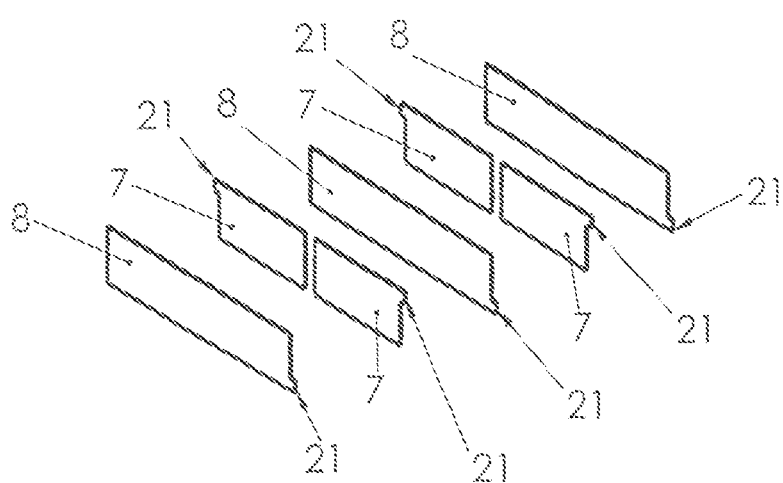
Figure 8:
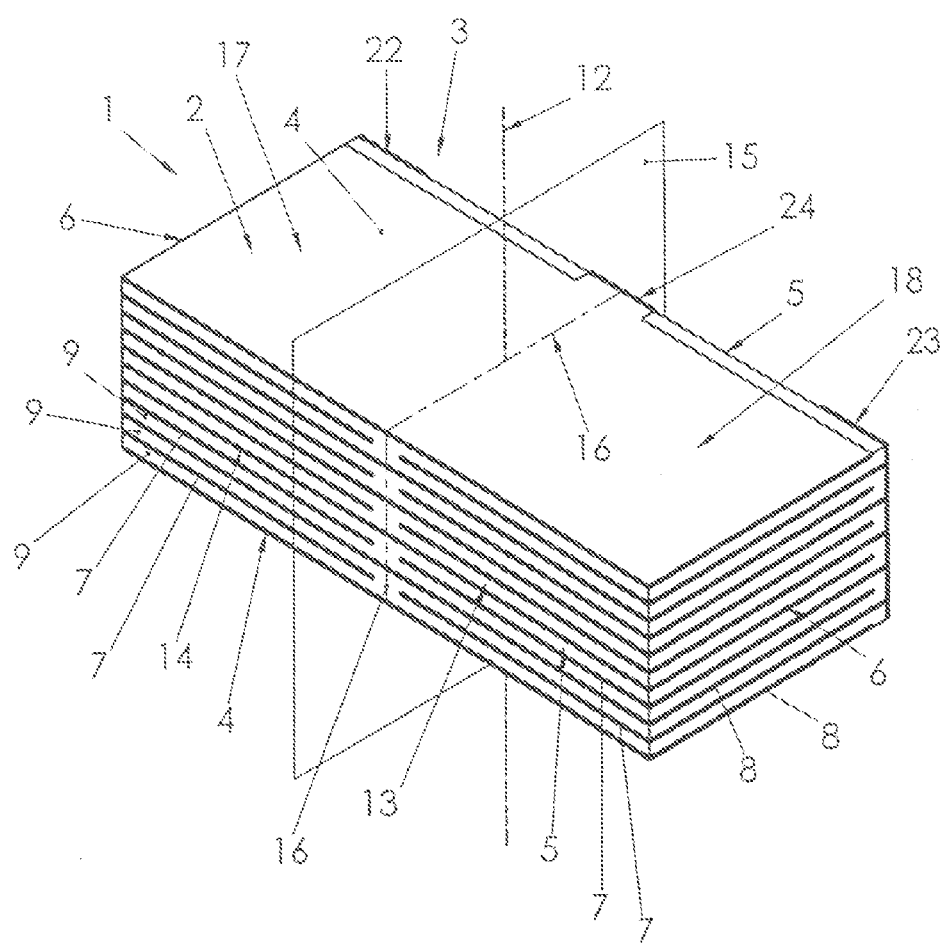
Figure 9:
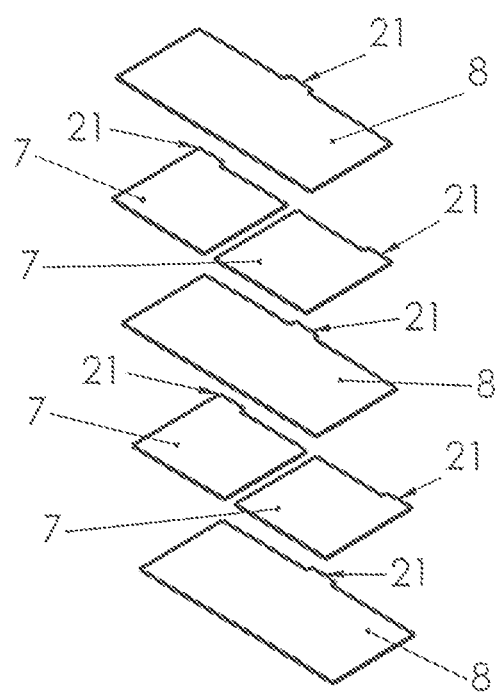

In the actuator as proposed, the excitation electrodes 7 and the common electrodes 8 may be arranged in parallel to the end faces 6 of the plate (see FIGS. 1, 4). The electrodes 7 and 8 may be arranged in parallel to the side surfaces 5 of plate 3 (see FIG. 6). Moreover, the electrodes 7 and 8 may be arranged in parallel to the main surfaces 4 of the plate 3 (See FIGS. 8, 11).

The electrically conductive electrodes 22, 23, 24 may be applied onto one of the side surfaces 5 of the plate 3 (see FIGS. 1, 8, 13, 15) or onto two of these surfaces (not shown in the figures). The electrically conductive electrodes 22, 23 and 24 may also be applied onto one (not shown in the figures) or two of the main surfaces 4 of the plate 3 (see FIG. 4). The electrodes 22, 23, 24 may also be applied onto the end faces 6 of the plate 3 (see FIGS. 6, 11, 14, 16).

Figure 13:
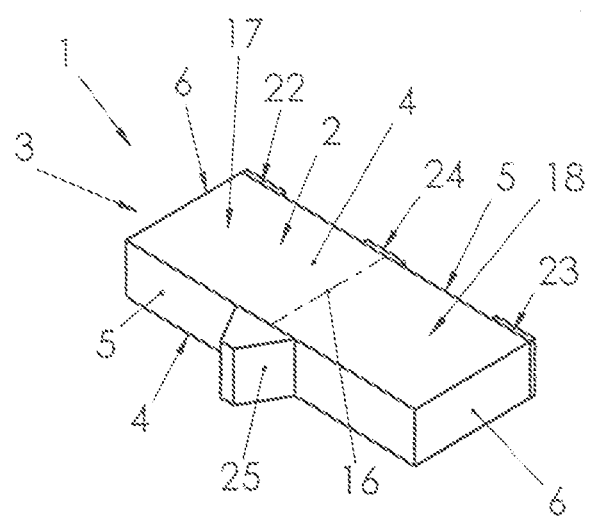
Figure 14:
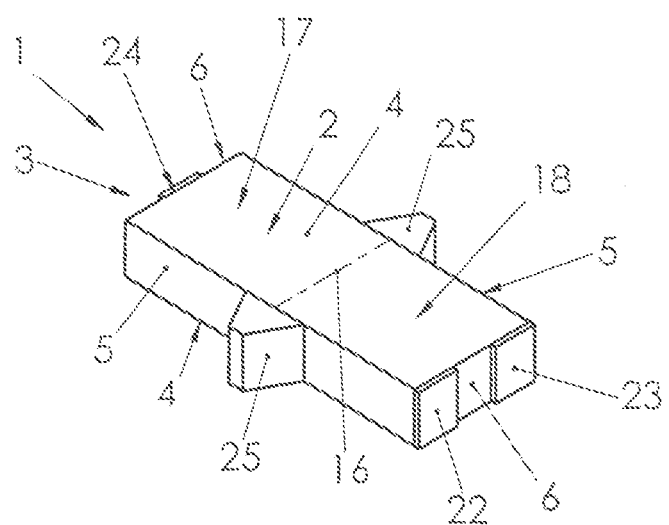

As shown in FIGS. 13, 14, the modified embodiments of the oscillator as proposed may have friction elements 25 fixed to one or two of the side surfaces 5 of the plate 3.

The friction elements are made of a hard, wear-resistant material, e.g. aluminum oxide $Al_2O_3$, zirconium oxide $ZrO_2$, silicon nitride $Si_3N_4$, silicon carbide SiC, boron nitride BN, boron carbide $B_4C$, tungsten carbide WC, titanium carbide TiC or a similar material.

These wear-resistant elements can be fixed to the plate 3 with the aid of materials which are chemically bonded to the piezoelectric ceramic of plate 3. This may be accomplished with lead-containing glass or a similar material. Furthermore, the elements may also be glued onto the plate 3 by an epoxy resin adhesive.

The friction elements may be made of a hard, wear-resistant plastic material having correspondingly resistant fillers as additive. These fillers include materials based on polyarylamide having a semi-crystalline structure and glass fiber, graphite fiber, metal powder, oxide ceramic powder or another material as filler, which solidifies the plastic material and increases the thermal conductivity.

These friction elements can be glued onto the plate 3 by means of solidly hardening epoxy resin adhesives.

Figure 15:
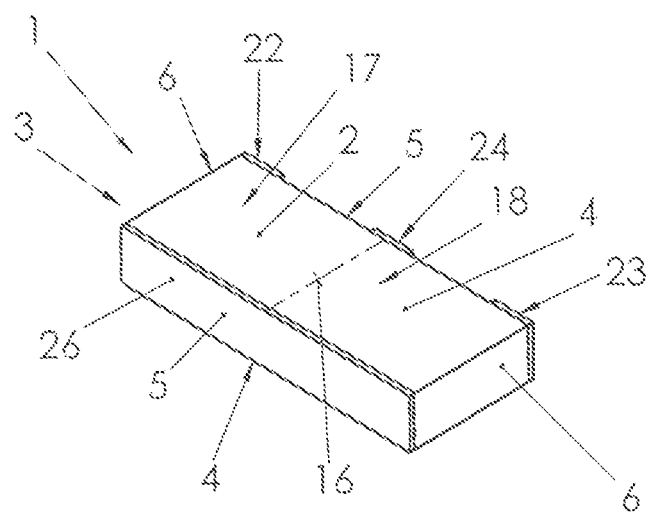
Figure 16:
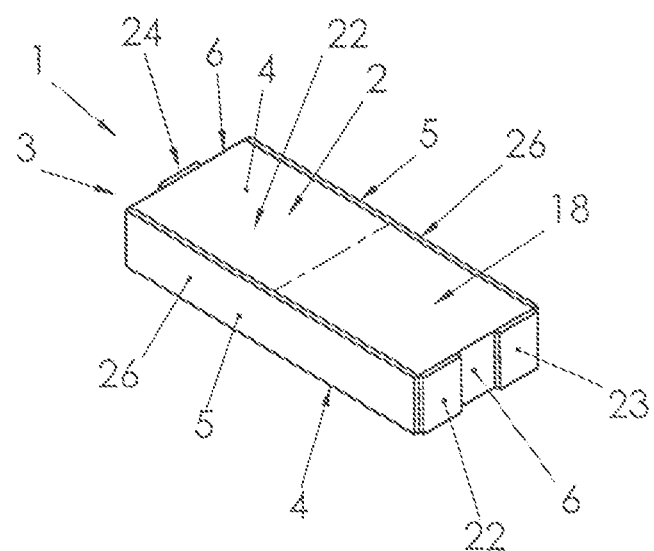

In other embodiments of the actuator as proposed friction layers 26 may be arranged on one or two of the side surfaces 5 of the plate 3, as is shown in FIGS. 15, 16.

The friction layers 26 may be made of a layer of hard, wear-resistant glass which is molten onto the surface of the plate 3. In such a glass aluminum powder, zirconium oxide powder or any other wear-resistant material may be used as filler. The layers 26 may also be produced by vapor-depositing a thin layer of titanium Ti, chromium Cr, titanium nitride TiN, titanium carbide TiC, titanium carbide nitride TiCN, chromium nitride CrN, titanium aluminum nitride TiAlN, zirconium nitride ZrN, titanium zirconium nitride TiZrN, titanium chromium nitride TiCrN or any other material.

To protect the surface of the plate 3 of the actuator 1 against humidity it may be coated with a thin layer of an organic lacquer, glass, ceramic or any other electrically non-conducting material (not shown in the figures).

A useful embodiment includes a control unit 27 (see FIG. 17) comprised of an autogenerator 28 with a direction selector switch 29.

Figure 18:
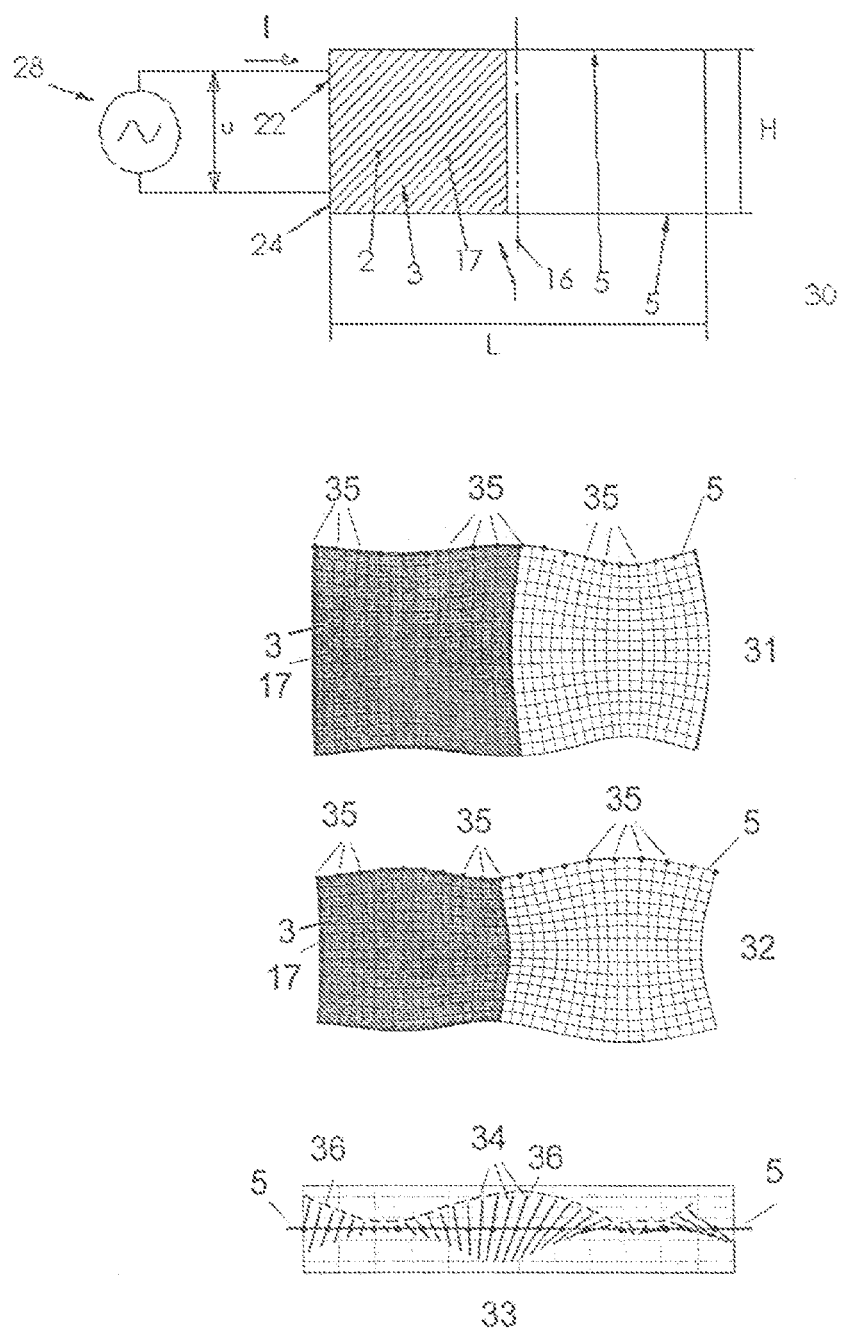

FIG. 18 shows a plate 30 and the generator for acoustic waves 17 which is connected to the autogenerator 28. An electric alternating voltage is applied to the electrodes 7 and 8 causing current i to flow through the actuator.

FIG. 18, numbers 31, 32 show deformation patterns of plate 3. Pos. 33 shows the path of motion 34 of points 35 disposed on the surface of the side surfaces 5 as well as the envelope curve 36 of the path of motion 34.

Figure 19:
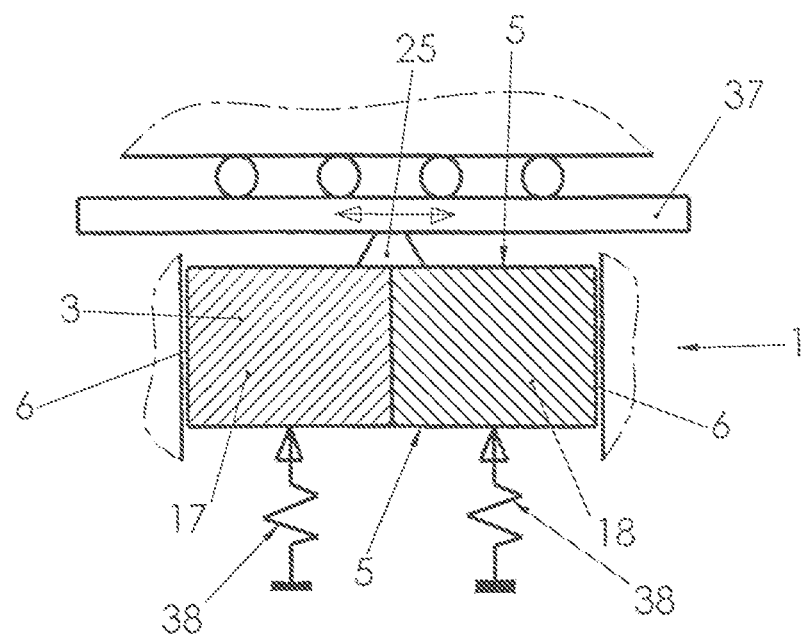

FIG. 19 shows an ultrasonic motor and an actuator 1 which comprises a friction element 25 interacting with a mobile friction rail 37. The actuator 1 is pressed by a spring 38 against the mobile friction rail 37.

Figure 20:
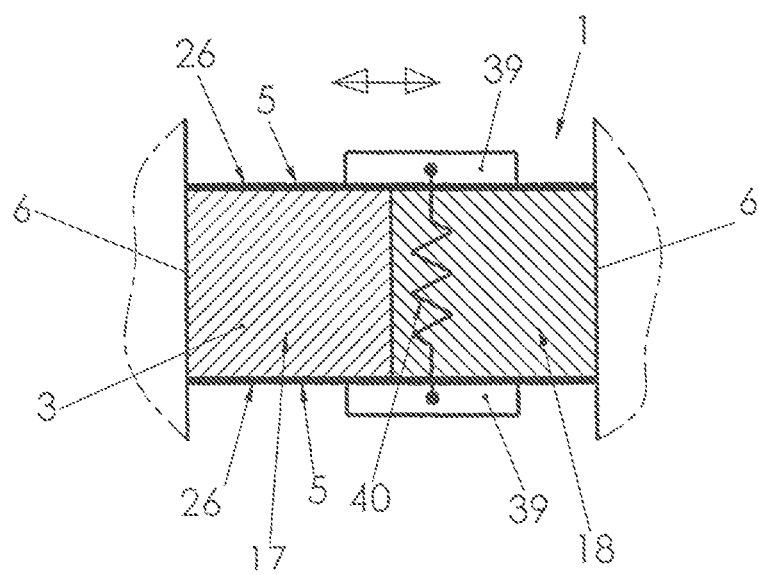

FIG. 20 shows an ultrasonic motor and an actuator 1 which comprises two friction layers 26 interacting with sliding blocks 39 which are pressed onto the side surfaces 5 of the actuator 1 by a tension spring 40.

Figure 21:
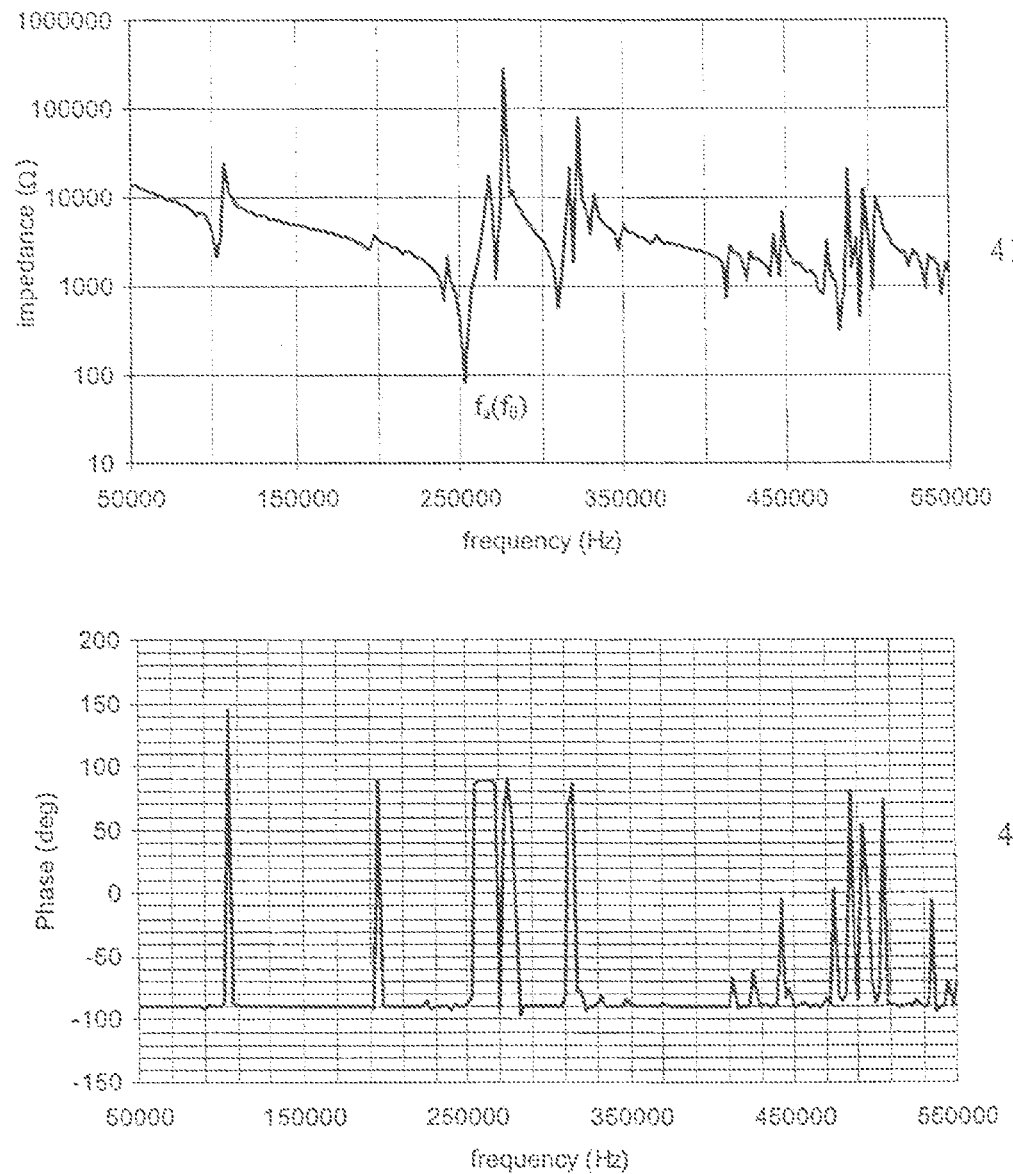

Pos. 41 in FIG. 21 shows the dependence of the input resistance Z of the actuator 1 on the frequency f of the electrical excitation voltage U, and Pos. 42 shows the dependence of the phase shift V between the electrical excitation voltage U on current i. The working frequency of the actuator 1 is equal to the frequency $f_a$.

Figure 22:
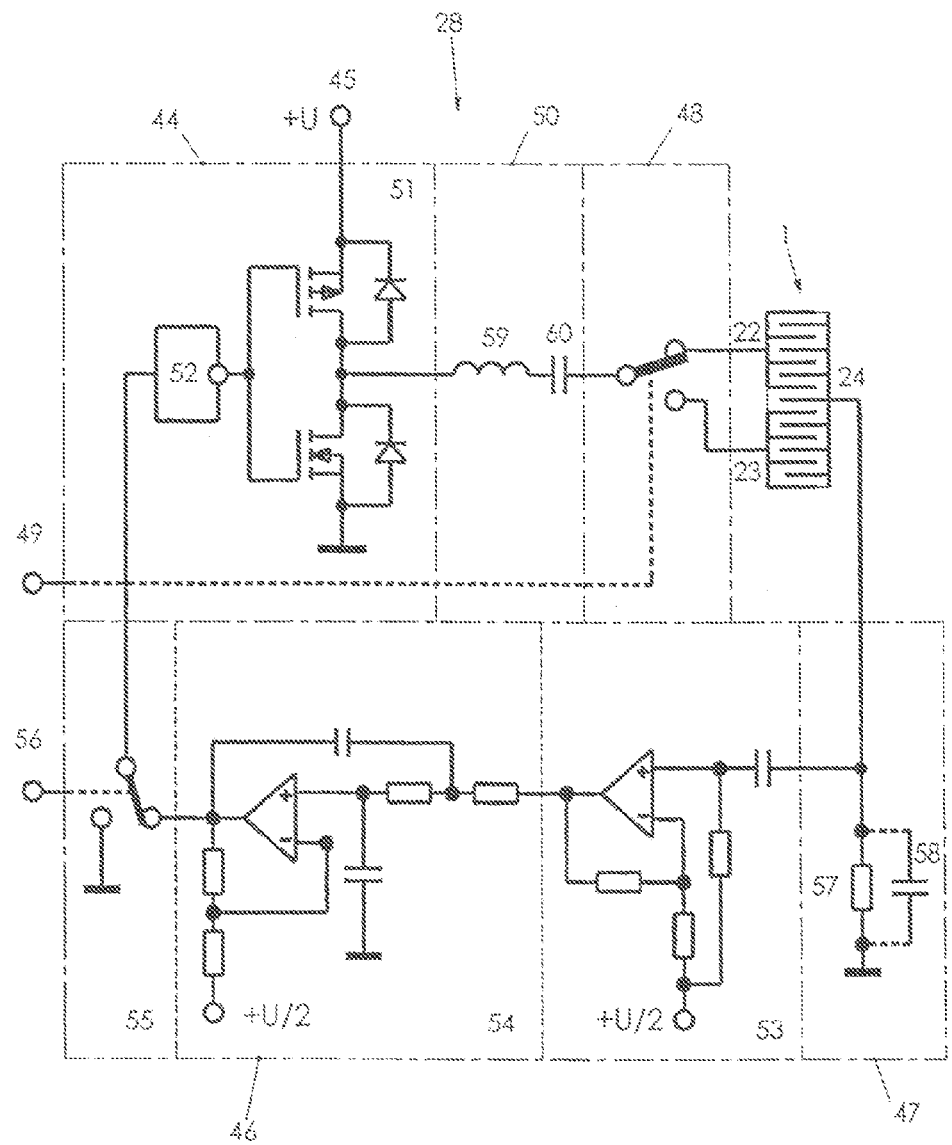

In the inventive embodiment of the autogenerator 28 according to FIG. 22 the control unit 27 may be configured as a single-channel autogenerator 43. Such an autogenerator may be comprised of a power switch 44 with a voltage supply input 45, a feedback loop 46, a feed back element 47, a direction reversing switch 48 with a control input 49 and a variable frequency filter 50. The supply voltage U is applied to the voltage supply input 45. The power amplifier 44 may consist of a half-bridge final amplifier 51 and a driver 52. The feedback loop 46 may include an amplifying section 53, a filter section 54 and a circuit breaker 55 with control input 56. The feedback element 47 may include a resistor 57, a capacitor 58 or both, which are then connected in parallel and to the group of the common electrodes 8. The variable frequency filter 50 may be comprised of an inductance coil 59 and a capacitor 60 of the series LC circuit.

Figure 23:
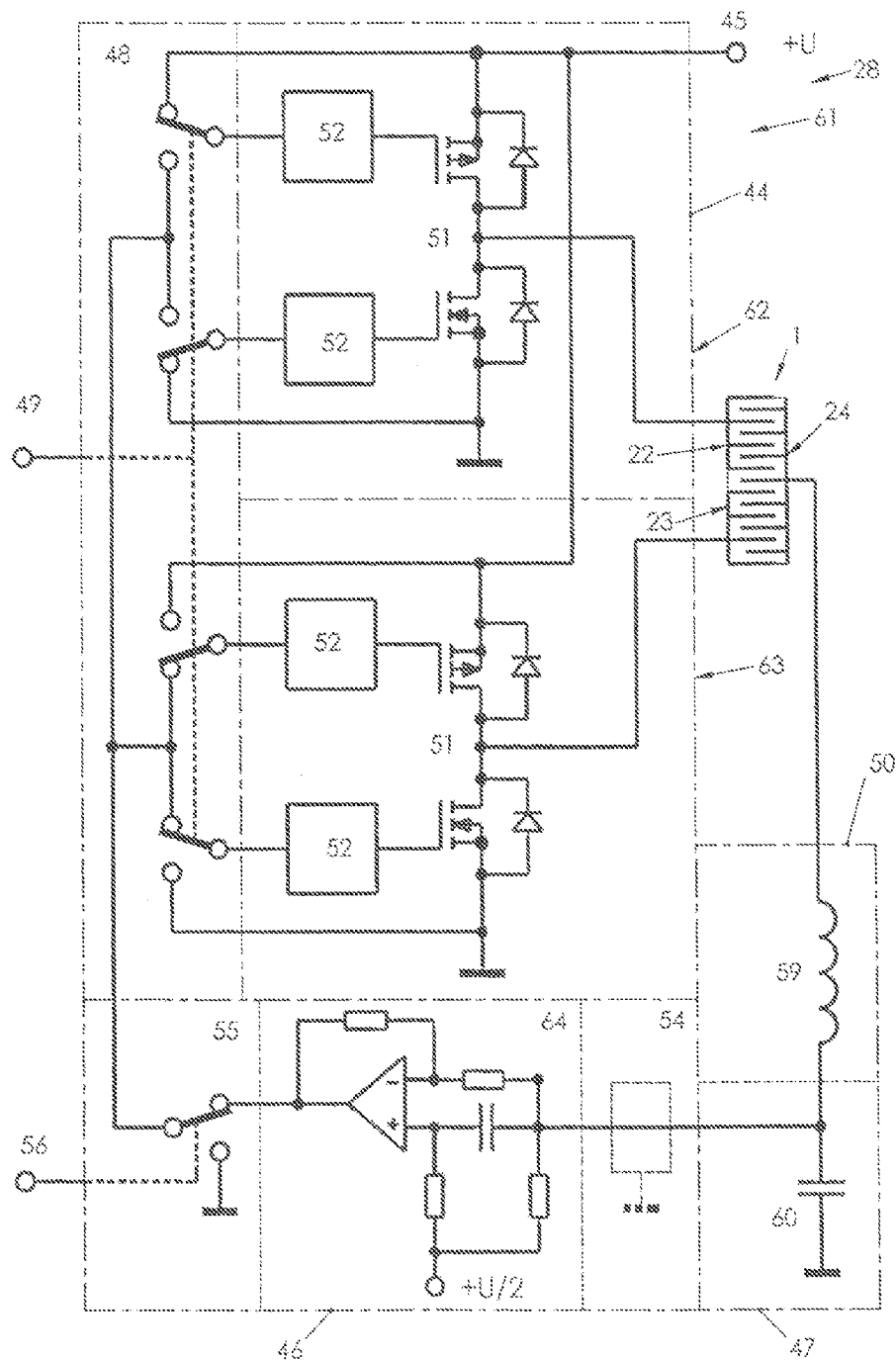

In the further inventive modified embodiment of the autogenerator 28 shown in FIG. 23 the control unit 27 may be configured as a dual-channel autogenerator 61. Such an autogenerator 61 is comprised of power amplifiers 44 forming two channels 62 and 63.

In all modifications of the autogenerator the capacitor 60 of the variable frequency filter 50 may be used instead of the feedback element 47, and the feedback loop 46 may additionally comprise a phase shifter section 64 (see FIG. 23).

In all modified embodiments the electrical capacitance of the capacitor 60 of the variable frequency filter 50 may be equal to the electrical capacitance between one of the groups of the excitation electrodes 13 or 14 and the group of the common electrodes.

In the following embodiment the control unit 27 may be comprised of a broad pulse voltage controller 65 with the voltage supply input 66, the output 67 of which is connected to the voltage supply input 45 of the autogenerator 28.

The broad pulse voltage controller 65 is comprised of a power amplifier 68, a filter 69 and an analog signal converter for a broad pulse signal 70 with an analog control input 71. The converter may also include a synchronization input 72.

The synchronization input 72 can be connected to a signal circuit 73 of the autogenerator 28 directly or via a frequency multiplier 74.

FIG. 20 shows an actuator according to the invention for driving an optical focusing unit 75. The actuator 1 is accommodated in a housing 76 of the focusing unit 75, on which guides 77 with the holders 78 of a lens group 79 slidable on them are attached. The actuator 1 is pressed against the side surfaces 5 of the sliding blocks 39, which are formed as hemispheres, by means of a profiled spring 80.

The piezoelectric actuator 1 as proposed works as follows: When a supply voltage is applied to the control unit 27 a voltage is generated by the autogenerator 28, the frequency of which is equal to the working frequency $f_0$ of the actuator 1 (see FIGS. 17, 18, Pos. 30). This voltage is supplied to the common electrodes 8 and to the group 13 or 14 of the excitation electrodes 7, forming together with the layers of the piezoelectric ceramic 9 the multilayer generators 17 and 18 for the acoustic standing wave.

By this, a time-variable electric field E acting on the layer 9 of the piezoceramic (see FIG. 3) is generated between the electrode groups 8 and 7, the vector of which is oriented along the polarization direction of the piezoceramic, i.e. along the polar axis 12 of the piezoceramic plate 3. As the piezoceramic layers 9 are thin (30-50 micrometers), it is possible to generate with small electrical voltages a sufficiently large electric field in the actuator. Therefore, the electrical voltage required for driving the actuator 1 can be reduced significantly.

The electric alternating field E acting on the piezoceramic has the effect that the piezoceramic plate 3 starts to expand and contract alternately at the frequency $f_0$ along the polar axis 12 and, furthermore, in two directions perpendicular with respect to each other. The piezoelectric module $d_{33}$ defines the efficiency of the deformation of the plate 3 along the polar axis and the piezoelectric module $d_{31}$ in the two other directions perpendicular with respect to each other.

Figure 11:
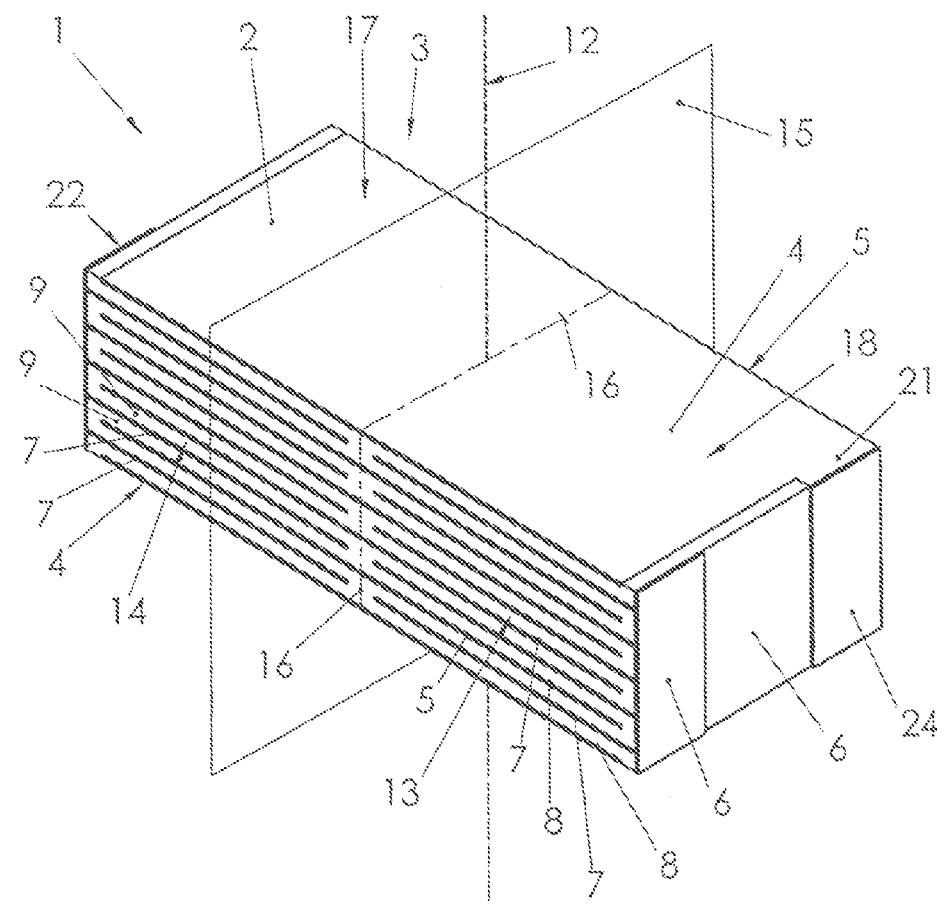
Figure 12:
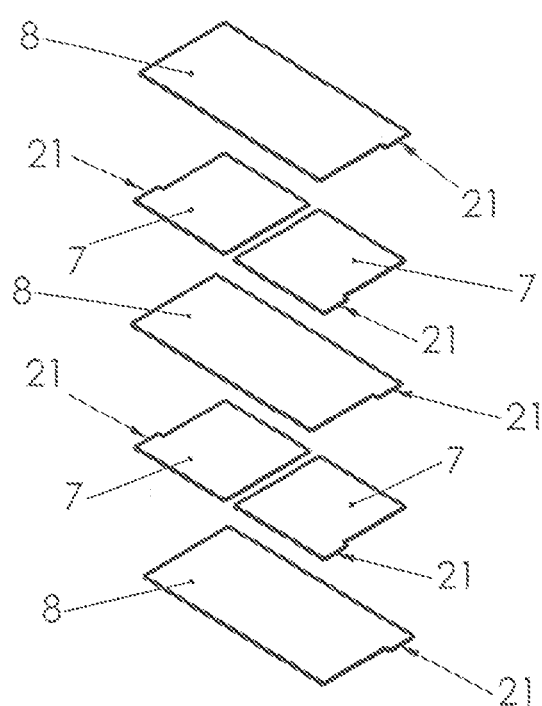

The polar axis 15 can extend perpendicularly to the end faces 6 (see FIGS. 1, 4), perpendicularly to the side surfaces 5 (see FIG. 6) and also perpendicularly to its main surfaces 4 (see FIG. 11).

The control unit 27 is realized in such a way that the working frequency $f_0$ generated by the supply voltage U is automatically kept equal to the resonance frequency $f_a$ (or close to it), said resonance frequency being equal to the resonance frequency of the asymmetric oscillations of plate 3 of the actuator 1 (see FIG. 19, Pos. 37) at which an asymmetric standing wave is generated in the actuator 1 by the generators 17 or 18. This wave differs from other types of waves in that during its excitation a prevailing inclination of the path of motion of the points disposed on the side surfaces 5 of the plate 3 is adopted.

The length L and the height H of the plate 3 represent the resonance dimensions for the excited wave. The thickness of the plate 3 does not represent a resonance dimension. Therefore, the principal deformation components of the excitation wave are always disposed in parallel with respect to the main surfaces 4 of the plate 3. The plate 3 is not substantially deformed with respect to its thickness. The generated wave therefore represents a "surface" wave extending parallel with respect to the main surfaces 4 of the plate 3.

FIG. 18, Pos. 31 and 32 show the two deformation phases of the main surface 4 of the piezoelectric plate 3 formed during the generation of an asymmetric standing wave in the actuator 1. The illustrations are time-shifted by half an oscillation period. The asymmetry of the standing wave is explained in FIG. 18, Pos. 33, which also shows the paths of motion of the points 34 of points 35 on the side surface 5 of the plate 3. Line 36 represents the envelope curve of the motion 34. This line asymmetrically repeats the motion of surface 15. Pos. 33 shows the dominating inclination of the path of motion of points 34 directed away from the generator 17 or 18.

The occurrence of the resonance and the resonance frequency of the asymmetric standing wave itself is determined by the chosen ratio L/H and the constructive realization of generators 17, 18 for acoustic oscillations, wherein these generators are disposed asymmetrically (see FIG. 18, Pos. 30) with respect to the symmetry surface 15 of plate 3 (with respect to each other, the generators 17, 18 are disposed symmetrically to the symmetry surface 15). The optimum ratio L/H is about 2.25. The resonance frequency $f_a$ of the plate having the optimum ratio L/H can be determined according to the formula $f_a = N/L$, wherein N is the frequency constant of the piezoceramic for the respective type of the standing wave and the material used is a piezoceramic one. For the piezoceramic PIC 181 of the company PI Ceramic, N=4352 kHz mm.

FIG. 19 shows a modified embodiment of the ultrasonic motor, in which a friction element 25 is fixed to the side surface 5 of the plate 3. By generating an asymmetric standing wave in the plate 3 the friction element 25 oscillates together with the surface 5 on a path of motion inclined with respect to the mobile friction rail 37, which forces the friction element to move in a direction away from the generator 17 or 18, that is, subject to the generator to which the electric voltage is applied.

FIG. 20 shows a modified embodiment of the ultrasonic motor with friction layers 26 applied to the side surfaces 5 of the plate 3. By generating an asymmetric standing wave in the plate 3 the points move in the center of the friction layers 26 on inclined paths, forcing the sliding blocks to move away from the actuated generator 17 or 18.

FIG. 21, Pos. 41 show the dependence of the input impedance Z of the actuator 1 on the frequency of the excitation voltage U in the range of 50 to 550 kHz. The graphic representation shows an actuator 1 with dimensions 16×6.6×3 mm made of the piezoceramic PIC 181 of the company PI Ceramic. Pos. 38 shows the dependence of the phase shift V of the excitation voltage U on the current I (see Pos. 30, FIG. 18) for this actuator 1.

The dependence of the impedance Z on the frequency (Pos. 41) demonstrates that only a particularly good resonance occurs within the range of the frequency $f_a$. This resonance is particularly good in a broad range whereby, at the frequency $f_a$, the electric resistance of the actuator 1 is approximately 10 times smaller than in other resonance frequency ranges.

As the angle of the phase shift V at the frequency $f_a$ is equal to 0, it is possible to build simply constructed exciter units for the actuator 1 which are based on the self-excitation principle, wherein the frequency of the excitation voltage for the actuator 1 is predefined by the mechanical parameters of the actuator.

This can be explained by the fact that the reactance of the actuator 1 at the resonance frequency $f_a$ is compensated by the reactance of the mechanical mass, so that the phase shift V at this frequency becomes equal to zero. That is, the zero position of the phase shift on the frequency scale is determined by the weight and the hardness of the actuator 1.

Figure 17:
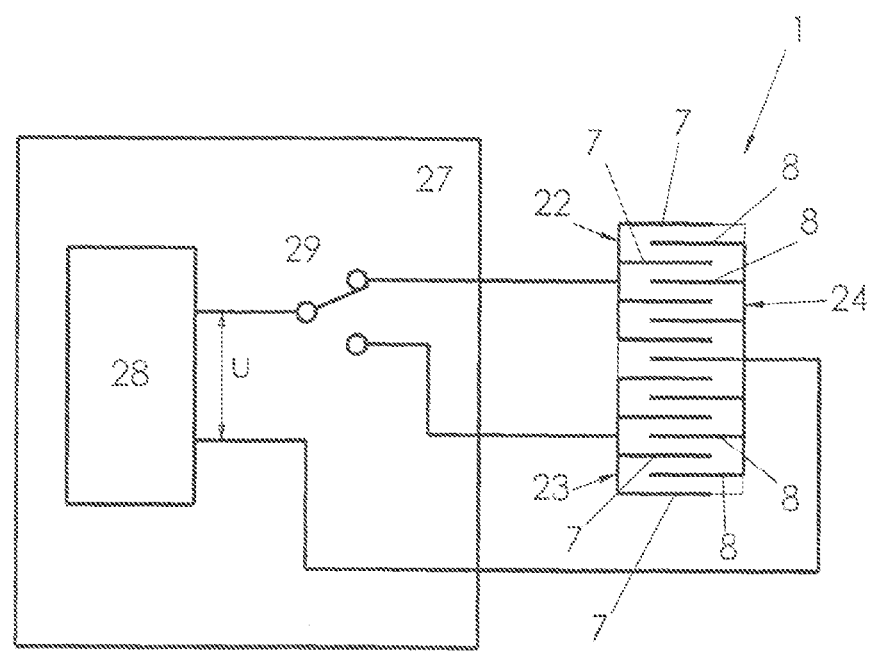

To automatically adjust the frequency $f_0$ of the voltage U, which is approximately equal to the resonance frequency $f_a$, the implementation of the control unit 27 as proposed consists of an autogenerator 28 (FIG. 17).

In general, the electrical circuit of the autogenerator 28 consists of a closed circuit of sections with a positive feedback, at which the phase shift at the frequency $f_a$ is equal to 0 or 360°, respectively, with the amplification coefficient at this frequency being greater than 1.

FIG. 22 shows the electrical circuit of the single-channel modification of the autogenerator 28. In this modification the closed circuit of sections consists of the actuator 1 with the feedback element 47, the feedback loop 46 with the amplifying section 53, the filter section 54, the circuit breaker 55, the power amplifier 44 and the variable frequency filter 50.

In this modification of the autogenerator the resistor 57 represents the feedback element on which the voltage is proportional with respect to the current I flowing through the actuator. The amplifying section 53 serves the signal amplification in the feedback loop 46. The filter section 54 serves the filtering of the first harmonic from the feedback signal which is formed in the feedback loop 46 with the amplifying element 53. The amplifier is a power amplifier 44 for the actuator 1. The variable frequency filter 50 is required for the tuning of the half-bridge final amplifier 51 on the actuator 1.

The filter section 54 and the variable frequency filter are band-pass filters having a large passband width, the resonance frequencies of which are tuned to the frequency $f_a$ of the actuator 1. The passband width of these filter is 10 ... 30% of the frequency $f_a$. The actuator 1 with the resistor 57 of the feedback element 47 represents a narrow-band filter with a passband width of 0.5 ... 1.0%.

The elements 50 and 54 do not cause any phase shift at the frequency $f_a$, but cause a phase shift at all other frequencies. The non-occurrence of the phase shift at the frequency $f_a$ means that, if the amplification coefficient of the amplifying section 53 is selected correspondingly, wherein the amplification coefficient in the entire electric circuit of the autogenerator 28 at the frequency $f_a$ is greater than 1, the autogenerator 28 always starts to oscillate at the frequency $f_a$. As the passband width of the actuator 1 with the feedback element 57 is significantly smaller than the passband width of the elements 54 and 50, the actuator 1 primarily determines the excitation frequency of the autogenerator 28.

The circuit breaker 55 allows the separation of the feedback loop 46 from the driver 52 of the power amplifier 44, by which the self-excitation of the generator 28 is stopped.

A capacitor 58 as feedback element 47 is used if only a small phase shift of the autogenerator 28 to the frequency $f_a$ is necessary.

FIG. 23 shows the dual-channel modification 61 of the autogenerator 28. The autogenerator 28 is comprised of the channels 62 and 63 which are connected to the feedback loop 46 by the direction reversing switch 48. The channels 62, 63 and the direction reversing switch 48 are configured such that, upon connecting the channel 62 or 63 to the feedback loop 46, the electrically conductive electrode 22 or 23 is separated from the neutral conductor and the voltage supply input 45. This increases the efficiency of the actuator 1.

In all modifications of the autogenerator 28 the capacitor 60 of the variable frequency filter 50 may be used as feedback element 47. This increases the signal level of the feedback.

The electric voltage applied to the capacitor 60 is phase-shifted by 90° in relation to the current I flowing through the actuator. The phase-shifting member 64 serves the phase compensation in the feedback loop, so that the signal is shifted by 90° in the opposite direction.

The capacitance of the capacitor 60 of the series LC circuit of the variable frequency filter 50 may be equal to the electric capacitance of the actuator, which is formed between one of the groups of the excitation electrodes and the group of the common electrodes. This improves the characteristics of the variable frequency filter, so that its characteristic resistance is optimal in relation to the resistance of the actuator 1.

Figure 24:
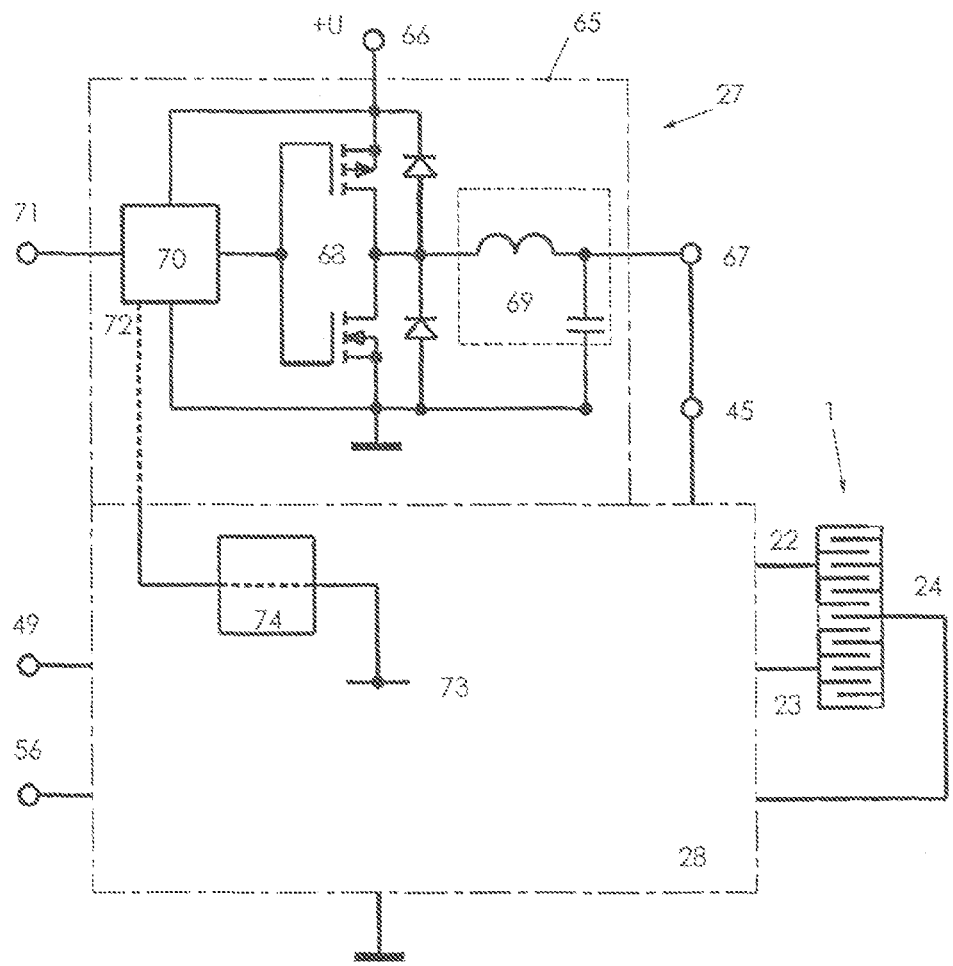
Figure 25:
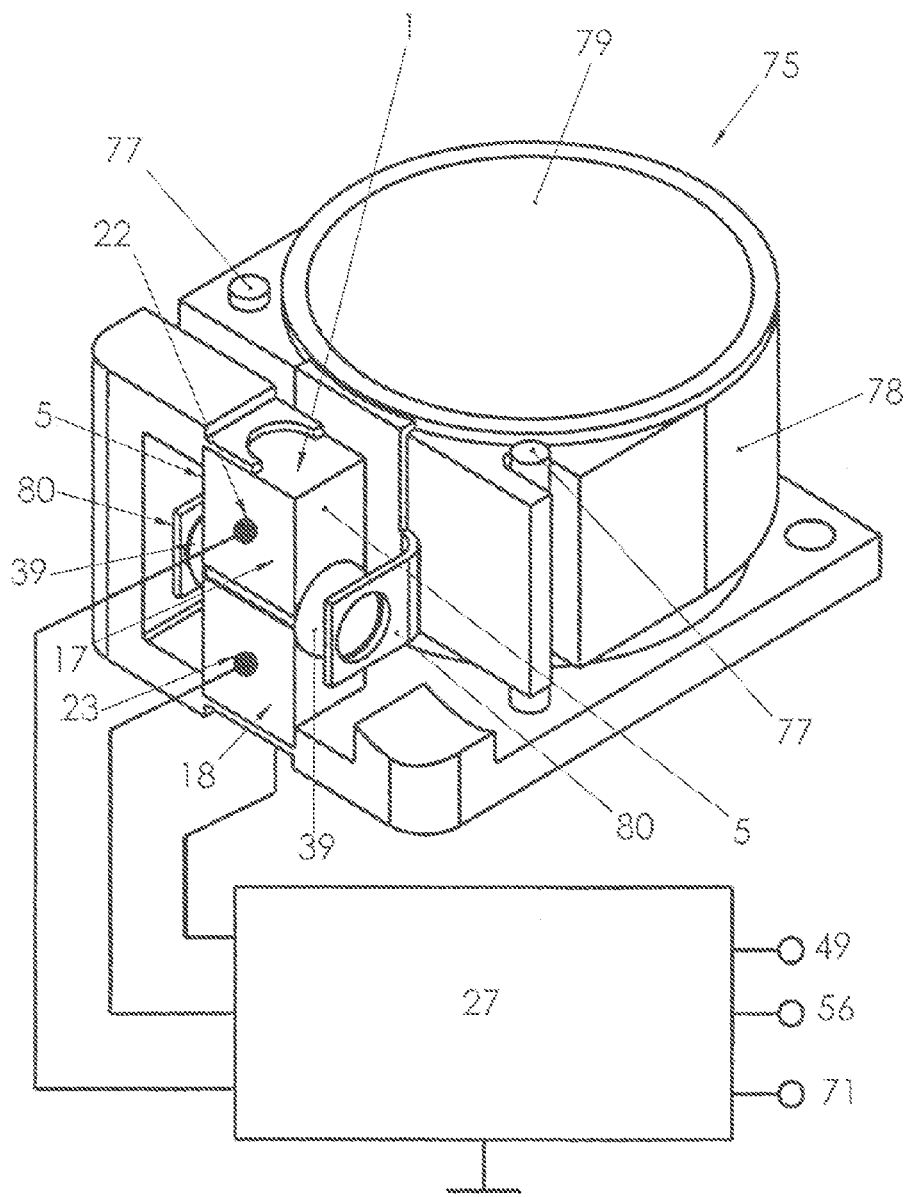

FIG. 24 shows a modified embodiment of the control unit 27 additionally comprising a broad pulse voltage controller 65. The broad pulse voltage controller 65 includes an analog signal converter for a broad pulse signal 70 with an analog control input 71. This converter generates a broad pulse signal which is supplied to the filter 69 via the power amplifier 68.

The electric voltage applied to the output 67 of the converter 65 is proportional with respect to the analog voltage at the output 71. From the output 67 the electric voltage is supplied to the voltage supply input 45 of the power amplifier 44. The voltage variation at the input 45 results in an increase or reduction of the excitation level for the actuator 1.

The converter 70 may comprise a synchronization input 72, which is directly connected to the signal circuit 73 of the autogenerator 28 or via the frequency multiplier 74 to the signal circuit, respectively.

The modification of the actuator in FIG. 20 operates as follows: As soon as the excitation voltage from the control unit 27 is applied to the generator 17 or 18 the actuator 1 causes a movement of the sliding blocks 39 which are pressed against the side surfaces 5 of the actuator 1 by the spring 80. The movement of the sliding blocks is transferred via the spring 80 to the holders so as to displace the lens group 79 on the guides 77.

Due to the waiver of the metallic acoustic oscillation resonator the realization according to the invention allows a reduction of the dimensions of the actuator by a factor of 3 to 5. Moreover, the invention permits a reduction of the electric excitation voltage of the actuator approximately by a factor of 100. The operating stability of the actuator is significantly higher because adhesive connections between the acoustic oscillation resonator and the piezoelectric converter are waived. The invention allows the construction of simple actuator control units, in which the frequency of the electric voltage exciting the actuator is generated by the actuator itself. This leads to a significant enhancement of the operating stability of the actuator over a large temperature range and mechanical stress range. The multilayer technology makes it possible to automate the manufacturing process and to reduce thereby the manufacturing costs. Moreover, the simpler construction of the control unit allows a reduction of its costs to a large extent.

List of Reference Numbers
1 actuator
2 acoustic oscillation resonator
3 right-angled piezoelectric plate
4 main surfaces of plate 3
5 side surfaces of plate 3
6 end faces of plate 3
7 excitation electrodes
8 common electrodes
9 piezoceramic layer
10, 11 polarization directions of the piezoceramic
12 polar axis of the piezoceramic plate 3
13, 14 groups of excitation electrodes 7
15 symmetry surface
16 intersecting line of the symmetry surface with the edges 4 and 5
17, 18 multilayer generators for acoustic standing waves
19, 20 parts of the common electrodes 8
21 electrically conductive shoulder
22, 23, 24 electrically conductive electrodes
25 friction element
26 friction layer
27 control unit
28 autogenerator
29 direction selector switch of control unit 27
30 schematic representation of plate 3
31, 32 deformation patterns of plate 3
33 representation of the paths of motion of the points
34 path of motion of points 35
35 surface points of side surface 5
36 envelope curve of path of motion 34
37 mobile friction rail
38 spring
39 sliding block
40 tension spring
41 impedance/frequency dependence of actuator 1
42 phase/frequency dependence of actuator 1
43 single-channel autogenerator
44 power amplifier for autogenerator 28
45 voltage supply input for power amplifier 44
46 feedback loop
47 feedback element
48 direction reversing switch of the autogenerator 28
49 control input of the reversing switch 48
50 variable frequency filter
51 half-bridge final amplifier
52 driver
53 amplifying section
54 filter section
55 circuit breaker
56 control input of the circuit breaker 55
57 resistor as feedback element 47
58 capacitor as feedback element 47
59 inductance coil of the variable frequency filter 50
60 capacitor of the variable frequency filter 50
61 dual-channel autogenerator
62, 63 channels of the autogenerator 61
64 phase-shifting member of the feedback loop 46
65 broad pulse voltage controller
66 voltage supply input of the broad pulse voltage controller 65
67 output of the broad pulse voltage controller 65
68 power amplifier of the broad pulse voltage controller 65
69 filter of the broad pulse voltage controller 65
70 analog signal converter for a broad pulse signal
71 analog control input for the analog signal converter 70
72 synchronization input of the analog signal converter 70
73 signal circuit of the autogenerator 28
74 frequency multiplier
75 optical focusing unit
76 housing of unit 75
77 guides
78 holders for optical lens group
79 optical lens group
80 profiled spring

What is claimed is:

1. Piezoelectric actuator, especially for an ultrasonic motor, comprising an acoustic oscillation resonator, characterized in that
the acoustic oscillation resonator is substantially formed as a rectangular piezoelectric plate with two main surfaces, two side surfaces and two end faces and has a multilayer structure in its interior which represents layers of excitation electrodes taking turns with the layers of the common electrodes and the layers of polarized ceramic provided therebetween, with the polarization vector extending perpendicularly with respect to the surface of the electrodes, that all excitation electrodes are divided into two groups not connected to each other, which are disposed symmetrically with respect to the symmetry surface of the aforementioned plate, wherein this symmetry surface extends perpendicularly with respect to the main and side surfaces of the plate, namely through the center thereof, with each group of the excitation electrodes forming together with the common electrodes and the piezoceramic therebetween a multilayer generator for an acoustic wave which is arranged asymmetrically with respect to the symmetry surface of the piezoelectric plate; and
wherein the common electrodes are comprised of two parts the configuration of which repeats the configuration of the excitation electrodes.

2. Piezoelectric actuator according to claim 1, characterized in that
the excitation electrodes and the common electrodes are arranged in parallel to the main surfaces of the piezoelectric plate.

3. Piezoelectric actuator according to claim 1, characterized in that
a friction element is provided on at least one side surface of the piezoelectric plate.

4. Piezoelectric actuator according to claim 1, characterized in that
a friction layer is provided on at least one side surface of the piezoelectric plate.

5. Piezoelectric actuator according to claim 1, characterized in that
the excitation electrodes and the common electrodes are arranged in parallel to the end faces of the piezoelectric plate.

6. Piezoelectric actuator according to claim 1,
characterized in that
the excitation electrodes and the common electrodes are arranged in parallel to the side surfaces of the piezoelectric plate.

7. Piezoelectric actuator, especially for an ultrasonic motor, comprising an acoustic oscillation resonator,
characterized by
the acoustic oscillation resonator is substantially formed as a rectangular piezoelectric plate with two main surfaces, two side surfaces and two end faces and has a multilayer structure in its interior which represents layers of excitation electrodes taking turns with the layers of the common electrodes and the layers of polarized ceramic provided therebetween, with the polarization vector extending perpendicularly with respect to the surface of the electrodes, that all excitation electrodes are divided into two groups not connected to each other, which are disposed symmetrically with respect to the symmetry surface of the aforementioned plate, wherein this symmetry surface extends perpendicularly with respect to the main and side surfaces of the plate, namely through the center thereof, with each group of the excitation electrodes forming together with the common electrodes and the piezoceramic therebetween a multilayer generator for an acoustic wave which is arranged asymmetrically with respect to the symmetry surface of the piezoelectric plate; and
wherein the piezoelectric actuator further includes a control unit having a single- or dual-channel autogenerator.

8. Piezoelectric actuator according to claim 7,
characterized in that
the control unit comprises a single-channel autogenerator with a power amplifier with a variable frequency filter, with a feedback loop connected to the feedback element and a direction reversing switch, which alternately couples the power amplifier to the corresponding acoustic wave generator.

9. Piezoelectric actuator according to claim 7,
characterized in that
the control unit comprises a dual-channel autogenerator with two power amplifiers, with a feedback loop connected to the feedback element and the direction reversing switch, which alternately couples the feedback loop to the corresponding channel of the autogenerator.

10. Piezoelectric actuator according to claim 8,
characterized in that
the feedback element is formed of a resistor, a capacitor or both components connected in parallel and is connected to the group of the common electrodes of the piezoelectric actuator.

11. Piezoelectric actuator according to claim 8,
characterized in that
the feedback element comprises a capacitor of a variable frequency filter in the form of a series LC circuit which is connected to the group of the common electrodes of the piezoelectric actuator.

12. Piezoelectric actuator according to claim 11,
characterized in that
the electrical capacitance of the capacitor of the series LC circuit is equal to the electrical capacitance of the actuator between one of the groups of the excitation electrodes and a group of the common electrodes.

13. Piezoelectric actuator according to claim 7,
characterized in that
the control unit additionally comprises a broad pulse voltage controller the output of which is connected to the input of the voltage source of the single-channel or dual-channel autogenerator, with the control input thereof forming an analog input for controlling the excitation level of the actuator.

14. Piezoelectric actuator according to claim 13,
characterized in that
the synchronization input of the broad pulse voltage controller is connected to the signal circuit of a single-channel or dual-channel autogenerator directly or via a frequency multiplier.

\* \* \* \* \*